(12) United States Patent
Yamaguchi (10) Patent No.: US 8,847,292 B2
(45) Date of Patent: Sep. 30, 2014

(54) METHOD FOR MANUFACTURING SEMICONDUCTOR DEVICE AND SEMICONDUCTOR DEVICE

(75) Inventor: Shinpei Yamaguchi, Tokyo (JP)

(73) Assignee: Sony Corporation, Tokyo (JP)

( * ) Notice: Subject to any disclaimer, the term of this patent is extended or adjusted under 35 U.S.C. 154(b) by 526 days.

(21) Appl. No.: 11/764,501

(22) Filed: Jun. 18, 2007

(65) Prior Publication Data

US 2008/0111167 A1 May 15, 2008

(30) Foreign Application Priority Data

Jun. 20, 2006 (JP) ................. 2006-169560

(51) Int. Cl.
| | |
|---|---|
| *H01L 29/76* | (2006.01) |
| *H01L 29/66* | (2006.01) |
| *H01L 29/78* | (2006.01) |
| *H01L 29/49* | (2006.01) |
| *H01L 21/28* | (2006.01) |
| *H01L 29/51* | (2006.01) |

(52) U.S. Cl.
CPC .......... *H01L 29/78* (2013.01); *H01L 29/66545* (2013.01); *H01L 29/517* (2013.01); *H01L 29/4958* (2013.01); *H01L 21/28079* (2013.01)
USPC ........... 257/288; 438/778; 257/412; 257/751; 257/753

(58) Field of Classification Search
USPC ............... 438/259, 270, 589, 592, 595, 926; 257/412, 751, 753
See application file for complete search history.

(56) References Cited

U.S. PATENT DOCUMENTS

| | | | | |
|---|---|---|---|---|
| 6,436,840 | B1 * | 8/2002 | Besser et al. ............... | 438/721 |
| 6,476,454 | B2 * | 11/2002 | Suguro ................... | 257/410 |
| 7,126,199 | B2 * | 10/2006 | Doczy et al. .............. | 257/412 |
| 7,157,780 | B2 * | 1/2007 | Harada ................... | 257/410 |
| 2005/0051854 | A1 * | 3/2005 | Cabral et al. ............... | 257/407 |

FOREIGN PATENT DOCUMENTS

| | | |
|---|---|---|
| JP | 09-246378 | 9/1997 |
| JP | 11168212 A * | 6/1999 |
| JP | 11-195621 | 7/1999 |
| JP | 2001-118804 | 4/2001 |
| JP | 2001-284466 | 10/2001 |
| JP | 2002-208695 | 7/2002 |
| WO | WO 2005/024906 | 3/2005 |

OTHER PUBLICATIONS

A Japanese Office Action dated Jan. 20, 2009 issued in connection with counterpart Japanese Patent Application No. 2006-169560.

(Continued)

*Primary Examiner* — David Vu
*Assistant Examiner* — Jonathan Han
(74) *Attorney, Agent, or Firm* — Dentons US LLP (57) ABSTRACT

Disclosed herein is a method for manufacturing a semiconductor device, the method including the step of forming a gate electrode that contains a metal over a semiconductor substrate with intermediary of a gate insulating film, the step including the sub-steps of, forming a first gate electrode layer that defines a work function of the gate electrode on the gate insulating film, forming a second gate electrode layer that has a barrier property for underlayers on the first gate electrode layer, and forming a third gate electrode layer of which resistance is lower than a resistance of the first gate electrode layer on the second gate electrode layer by chemical vapor deposition.

7 Claims, 4 Drawing Sheets

(56) References Cited

OTHER PUBLICATIONS

Y. Akasaka et al.; Impact of Electrode-side Chemical Structures on Electron Mobility in Metal/Hf02 MISFETs with sub-1 nm EOT; Symposium on VLSI Technology Digest of Technical Papers; 2005.

Japanese Office Action dated Apr. 22, 2008 for Application No. 2006-169560.
Japanese Office Action issued on Aug. 4, 2008 in connection with JP Application No. 2006-169560.

\* cited by examiner

METHOD FOR MANUFACTURING SEMICONDUCTOR DEVICE AND SEMICONDUCTOR DEVICE

CROSS REFERENCES TO RELATED APPLICATIONS

The present invention contains subject matter related to Japanese Patent Application JP 2006-169560 filed in the Japan Patent Office on Jun. 20, 2006, the entire contents of which being incorporated herein by reference.

BACKGROUND OF THE INVENTION

1. Field of the Invention

The present invention relates to a method for manufacturing a semiconductor device and a semiconductor device, and particularly to a method for manufacturing a semiconductor device that has a metal gate electrode and a semiconductor device obtained based on the method.

2. Description of the Related Art

Metal gate electrodes have been studied as an alternative technique to existing polycrystalline silicon (Poly-Si) gate electrodes. When a metal gate electrode is integrated into an N-channel MOS field effect transistor (NMOSFET) and a P-channel MOS field effect transistor (PMOSFET), a work function control metal having a proper work function needs to be used for the gate electrode of each of the transistors in order to achieve a proper threshold voltage of each of the transistors. However, the work function control metal is not necessarily a low-resistance material. Therefore, forming a gate electrode only by use of the work function control metal is expected to lead to increased gate resistance, which will result in a longer time until the voltage applied to the transistor reaches the threshold voltage of the transistor and hence lower transistor speed.

A method has been proposed to decrease the gate resistance of an entire gate electrode in order to avoid this problem. In this method, a thin work function control metal is deposited over a substrate with the intermediary of a gate insulating film therebetween, and then a low-resistance metal such as tungsten (W) or ruthenium (Ru) is deposited as an upper electrode with a large thickness (refer to e.g. Y. Akasaka, et. al "Impact of Electrode-side Chemical Structure on Electron Mobility in Metal/HfO2 MISFETs with sub-1 nm EOT" Symposium on VLSI Technology Digest of Technical Papers, (USA), 2005, p. 228).

SUMMARY OF THE INVENTION

However, studies made by the present inventors have revealed that a problem will occur if a thin work function control metal is deposited over a semiconductor substrate with the intermediary of a gate insulating film therebetween and then W is deposited as an upper electrode by e.g. chemical vapor deposition (CVD) as described above. Specifically, at the time of the deposition of W, tungsten hexafluoride ($WF_6$) employed as the deposition gas reacts with the underlying work function control metal and fluorine enters the gate insulating film, which leads to damage to these underlayers and hence significantly deteriorates the yield of the semiconductor device.

There is a need for the present invention to provide a method for manufacturing a semiconductor device, allowing prevention of damage to underlayers at the time of deposition of an upper electrode by CVD, and provide a semiconductor device obtained based on the method.

According to an embodiment of the present invention, there is provided a method for manufacturing a semiconductor device. The method includes the step of forming a gate electrode that contains a metal over a semiconductor substrate with the intermediary of a gate insulating film. In the step of forming the gate electrode, the following sub-steps are sequentially carried out. Specifically, initially in the step (a), a first gate electrode layer that defines the work function of the gate electrode is formed on the gate insulating film. In the subsequent step (b), a second gate electrode layer that has a barrier property for the underlayers is formed on the first gate electrode layer. In the subsequent step (c), a third gate electrode layer of which resistance is lower than that of the first gate electrode layer is formed on the second gate electrode layer by chemical vapor deposition (CVD).

According to such a method for manufacturing a semiconductor device, in the step (b), the second gate electrode layer having a barrier property for protecting the underlayers is formed on the first gate electrode layer. This prevents damage to the first gate electrode layer and the gate insulating film due to a deposition gas employed for the CVD in the step (c), in which the third gate electrode layer is formed by the CVD on the second gate electrode layer. Furthermore, the third gate electrode layer of which resistance is lower than that of the first gate electrode layer is formed, which offers the gate electrode having a lower resistance. This shortens the time until the voltage applied to the transistor reaches the threshold voltage of the transistor, which enhances the transistor speed and reduces the power consumption of the transistor.

According to another embodiment of the present invention, there is provided a semiconductor device including a gate electrode configured to contain a metal and be formed over a substrate with the intermediary of a gate insulating film. The gate electrode is formed by sequentially depositing a first gate electrode layer that defines the work function of the gate electrode, a second gate electrode layer that has a barrier property for the underlayers, and a third gate electrode layer of which resistance is lower than that of the first gate electrode layer.

According to such a semiconductor device, the third gate electrode layer of which resistance is lower than that of the first gate electrode layer is formed. This shortens the time until the voltage applied to the transistor reaches the threshold voltage of the transistor, which enhances the transistor speed and reduces the power consumption of the transistor.

As described above, according to the method for manufacturing a semiconductor device and the semiconductor device in accordance with the embodiments of the invention, at the time of formation of the third gate electrode layer, damage to the first gate electrode layer and the gate insulating film due to a deposition gas employed for CVD is prevented, which can offer an enhanced yield of the semiconductor device. Furthermore, the speed of the transistor is enhanced and the power consumption of the transistor is reduced, which allows the transistor to achieve higher performance and lower power consumption.

DETAILED DESCRIPTION OF THE PREFERRED EMBODIMENTS

Embodiments of the present invention will be described in detail below with reference to the accompanying drawings. In each of the descriptions of the embodiments, the configuration of a semiconductor device will be explained based on the order of manufacturing steps thereof.

First Embodiment

With reference to FIGS. 1A to 2G, which are sectional views of manufacturing steps, a method for manufacturing a PMOSFET will be described below as one example of a method for manufacturing a semiconductor device according to a first embodiment of the present invention. In the present embodiment, a gate electrode is formed in such a manner as to be buried.

Figure 1A:
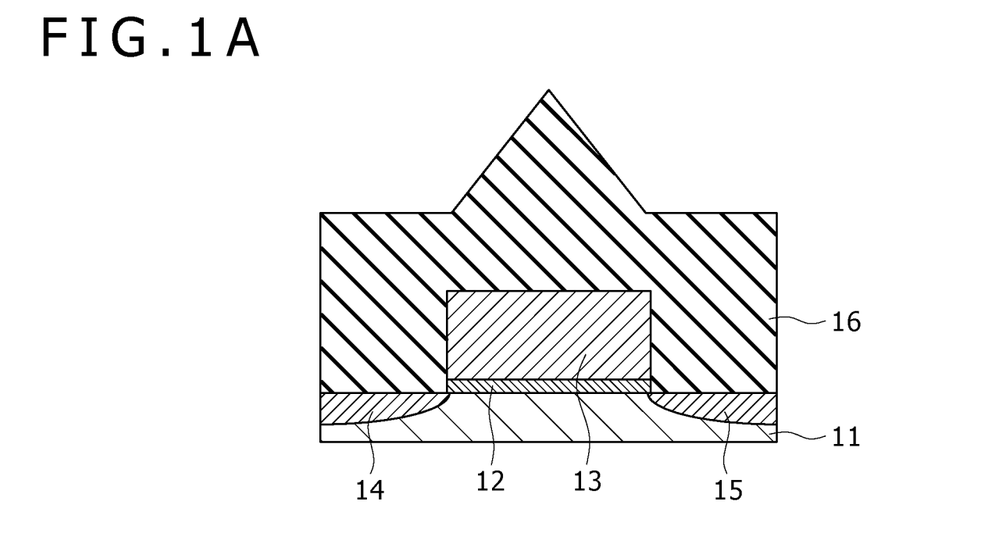
FIGS. 1A to 1C are sectional views (first group) for explaining manufacturing steps of a method for manufacturing a semiconductor device according to a first embodiment of the present invention.

As shown in FIG. 1A, by a method similar to a manufacturing method for a typical PMOSFET, a dummy electrode 13 composed of Poly-Si is formed over a semiconductor substrate 11 formed of a silicon substrate in which element isolation regions (not shown) are formed, with the intermediary of a gate insulating film 12 composed of a silicon oxide between the semiconductor substrate 11 and the dummy electrode 13. Subsequently, a p-type impurity is introduced by e.g. ion implantation into the semiconductor substrate 11 on both the sides of the dummy electrode 13 with use of the dummy electrode 13 as the implantation mask, and then the impurity is activated through thermal treatment, so that source and drain regions 14 and 15 are formed. Thereafter, an interlayer insulating film 16 formed of e.g. silicon dioxide ($SiO_2$) single-layer film or $SiO_2$/silicon nitride (SiN) multi-layer film is so formed over the semiconductor substrate 11 that the dummy electrode 13 is covered.

In this example, the source and drain regions 14 and 15 are formed in the semiconductor substrate 11 on both the sides of the dummy electrode 13. Alternatively, the source and drain regions 14 and 15 may be formed in the semiconductor substrate 11 on both the sides of the dummy electrode 13 with the intermediary of lightly-doped drain (LDD) regions (not shown). For forming of this configuration, a low concentration of a p-type impurity is introduced into the semiconductor substrate 11 on both the sides of the dummy electrode 13 to thereby form the LDD regions. Thereafter, sidewalls (not shown) are formed on both the sides of the dummy electrode 13, and then a high concentration of the p-type impurity is introduced with use of the dummy electrode 13 and the sidewalls as the mask, so that the source and drain regions 14 and 15 are formed.

Figure 1B:
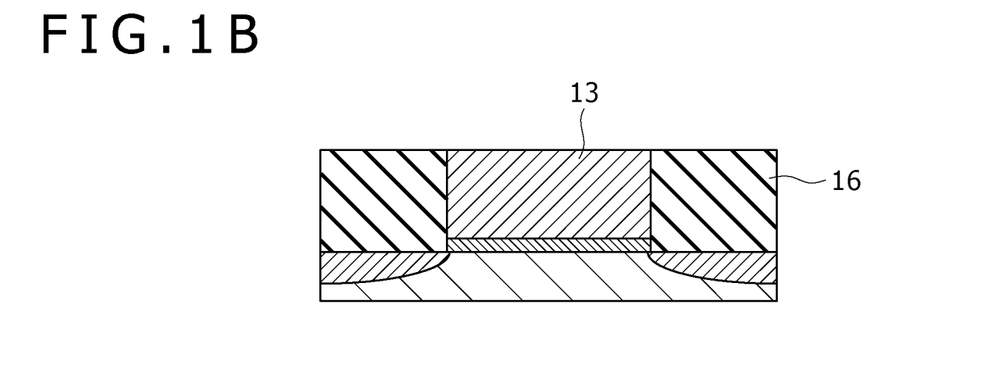

After the formation of the interlayer insulating film 16, as shown in FIG. 1B, the interlayer insulating film 16 is removed by chemical mechanical polishing (CMP) until the surface of the dummy electrode 13 is exposed.

Figure 1C:
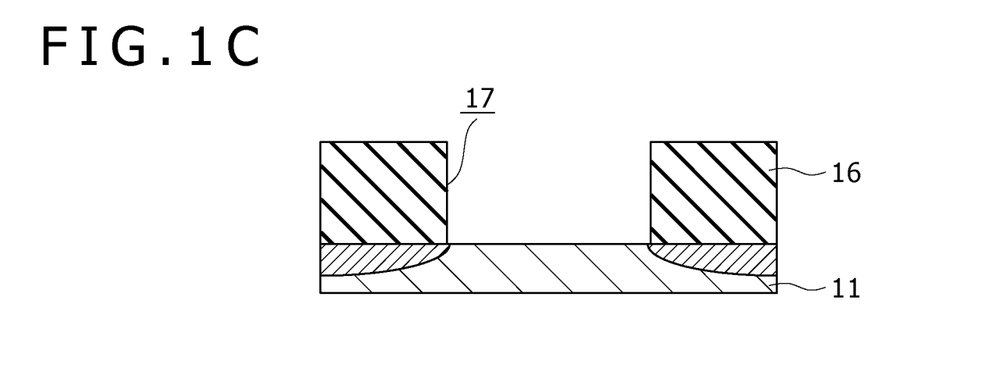

Subsequently, as shown in FIG. 1C, the dummy electrode 13 is removed by dry etching in which e.g. a mixture gas of sulfur hexafluoride ($SF_6$), chlorine ($Cl_2$), and oxygen ($O_2$) is employed as the etching gas. Thereafter, the gate insulating film 12 is removed by wet etching with use of a diluted hydrofluoric acid (DHF), so that a recess 17 that reaches the semiconductor substrate 11 is formed. A gate electrode is to be formed in the recess 17 as described later. Therefore, the width of the recess 17 defined by the width of the dummy electrode 13 is equivalent to a gate length Lg. In this example, the width of the recess 17 is e.g. 50 nm.

Figure 2D:
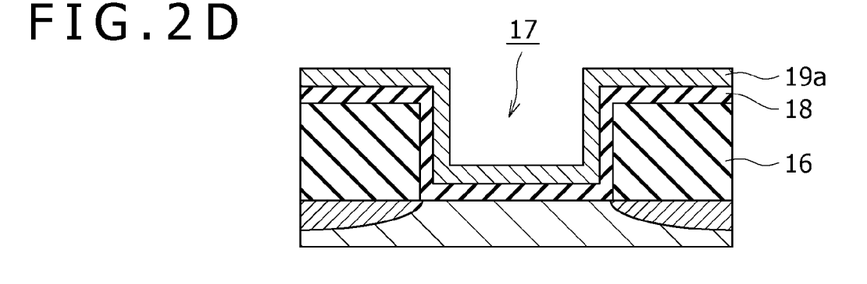
FIGS. 2D to 2G are sectional views (second group) for explaining manufacturing steps of the method for manufacturing a semiconductor device according to the first embodiment.

After the formation of the recess 17, as shown in FIG. 2D, a gate insulating film 18 composed of e.g. hafnium dioxide ($HfO_2$) and having a film thickness of e.g. 3 nm is formed on the interlayer insulating film 16 in such a manner as to cover the inner wall of the recess 17. As the material of the gate insulating film 18, besides $HfO_2$, any of the following materials is also available: silicon dioxide ($SiO_2$), silicon oxynitride (SiON), hafnium silicate (HfSiO), nitrided hafnium silicate (HfSiON), hafnium oxynitride (HfON), and hafnium titanate (HfTiO).

After the formation of the gate insulating film 18, a gate electrode is formed in such a manner as to be buried in the recess 17 with the intermediary of the gate insulating film 18. The gate electrode is formed by sequentially depositing a first gate electrode layer, second gate electrode layer, and third gate electrode layer as described below.

Specifically, a first gate electrode layer 19a that defines the work function of the gate electrode is formed on the second gate insulating film 18 in such a manner as to cover the inner wall of the recess 17, over which the gate insulating film 18 is provided. The first gate electrode layer 19a is composed of a metal-containing material having a proper work function (e.g. 4.8 eV to 5.2 eV) for achievement of a proper threshold voltage of the PMOSFET. In this example, the first gate electrode layer 19a composed of Ru and having a film thickness of 5 nm is formed by e.g. physical vapor deposition (PVD), CVD, or atomic layer deposition (ALD).

Instead of Ru, the first gate electrode layer 19a may be composed of a pure metal such as platinum (Pt), nickel (Ni), iridium (Ir), W or rhenium (Re), or an alloy, silicide, nitride or oxide of any of these metals.

Figure 2E:
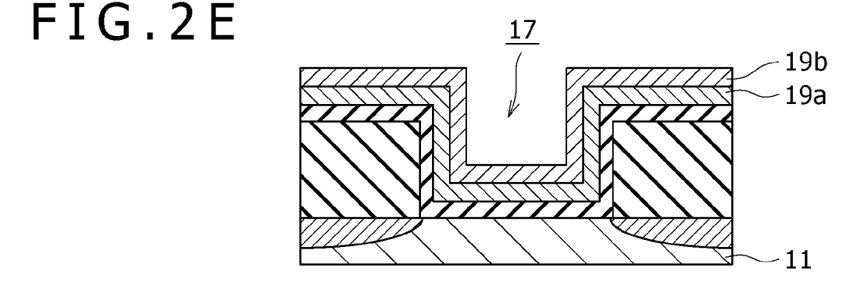

Referring next to FIG. 2E, a second gate electrode layer 19b having a barrier property for protecting the underlayers is formed on the first gate electrode layer 19a in such a manner as to cover the inner wall of the recess 17, over which the first gate electrode layer 19a is provided. In this example, in a later step, the third gate electrode layer composed of W is to be formed by CVD in which e.g. $WF_6$ is employed as the deposition gas. Therefore, the second gate electrode layer 19b is formed of a material having a barrier property against $WF_6$. This prevents reaction of $WF_6$ with the underlying first gate electrode layer 19a and damage to the gate insulating film 18 due to entry of F therein. It is preferable that the film thickness of the second gate electrode layer 19b be set as small as possible, without failure in realization of the barrier property for the underlayers, in order to prevent deterioration of the burying property of the third gate electrode layer at the time of burying thereof in the recess 17.

In this example, the second gate electrode layer 19b composed of e.g. W and having a film thickness of 5 nm is formed by e.g. physical vapor deposition (PVD) based on sputtering. One example of the deposition condition of this PVD is as follows: a directional magnetron sputtering apparatus in which a W target is disposed is used; the DC power is 2000 W; and the gas flow rate of an argon (Ar) gas is set to 80 ml/min. This gas flow rate indicates the volume flow rate when the gas is in its standard state.

As the second gate electrode layer 19b, instead of the W film deposited by PVD, an alloy film containing any of W, tantalum (Ta), titanium (Ti), hafnium (Hf) and molybdenum (Mo) or a film composed of a nitride of any of these metals may be formed. Furthermore, the deposition method is not limited to PVD but CVD or another method may be used. However, if a deposition gas containing F is employed in deposition of W or the like by CVD, F will damage the underlayers. Therefore, a method other than CVD needs to be used.

Instead of the film deposition, the surface of the first gate electrode layer 19a may be nitrided to thereby form the second gate electrode layer 19b having a barrier property for the underlayers. However, the work function will change if the nitridation of the first gate electrode layer 19a proceeds to the vicinity of the interface with the gate insulating film 18. Therefore, only the surface side of the first gate electrode layer 19a is nitrided to thereby form a modified layer. This modified layer serves as the second gate electrode layer 19b. As the surface nitridation treatment, plasma nitridation treatment or thermal nitridation treatment is carried out for the surface of the first gate electrode layer 19a. One example of the treatment condition of the plasma nitridation treatment is as follows: a nitrogen ($N_2$) gas is employed; the pressure of the treatment atmosphere is set to 2.67 Pa; and the power of the source power supply is set to 300 W. Furthermore, one example of the treatment condition of the thermal nitridation treatment is as follows: an ammonia ($NH_3$) gas is employed; and the semiconductor substrate 11 is heated at 700° C.

Figure 2F:
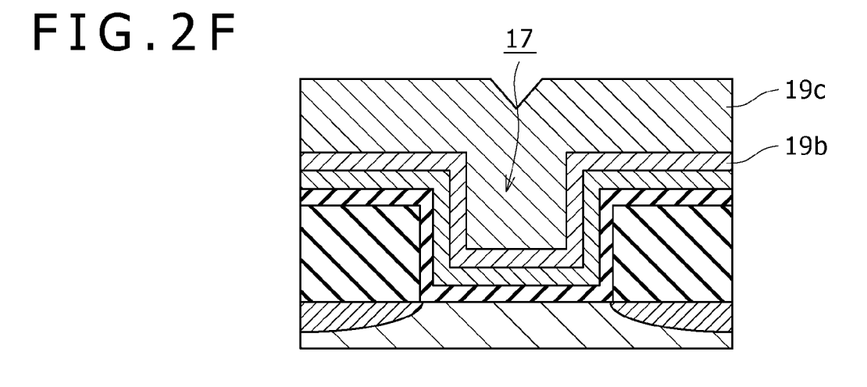

After the formation of the second gate electrode layer 19b, as shown in FIG. 2F, a third gate electrode layer 19c of which resistance is lower than that of the first gate electrode layer 19a is formed by CVD on the second gate electrode layer 19b in such a manner as to fill the recess 17, over which the second gate electrode layer 19b is provided. This results in the state in which the recess 17 is filled with the first gate electrode layer 19a, the second gate electrode layer 19b, and the third gate electrode layer 19c. In this example, the third gate electrode layer 19c is composed of e.g. W. The deposition of W by CVD can offer an excellent burying property, and hence it is possible to fill the recess 17 with the third gate electrode layer 19c without generation of a void.

The material of the third gate electrode layer 19c having a resistance lower than that of the first gate electrode layer 19a is not limited to W, but it is also possible to use a material containing another metal such as Ru as long as the resistance of the metal-containing material is lower than that of the first gate electrode layer 19a.

An example of the condition of the W deposition by CVD is as follows: $WF_6$, $N_2$, hydrogen ($H_2$), and Ar are employed as the deposition gas; the gas flow rate $WF_6/N_2/H_2/Ar$ is set to 75/300/500/2200 (ml/min); and the deposition temperature is set to 450° C. This gas flow rate indicates the volume flow rate when the gas is in its standard state.

Figure 2G:
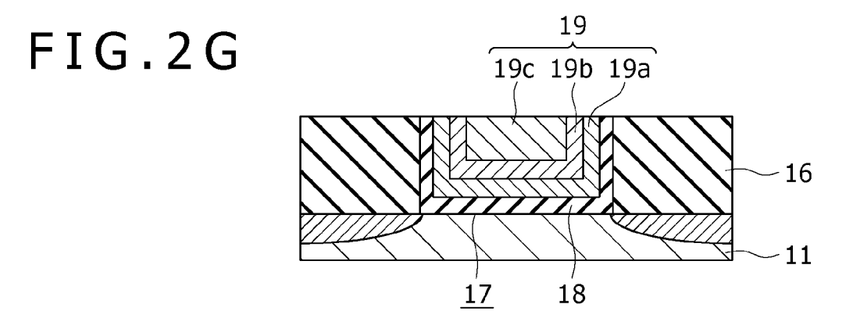

After the formation of the third gate electrode layer 19c, as shown in FIG. 2G, the third gate electrode layer 19c, the second gate electrode layer 19b, the first gate electrode layer 19a, and the gate insulating film 18 other than those in the recess 17 are removed by e.g. CMP until the surface of the interlayer insulating film 16 is exposed. As a result, a gate electrode 19 obtained by sequentially depositing the first gate electrode layer 19a, the second gate electrode layer 19b, and the third gate electrode layer 19c is formed in the recess 17 with the intermediary of the second gate insulating film 18. Although the gate insulating film 18 on the interlayer insulating film 16 is removed in this example, this gate insulating film 18 may be left. However, if the gate insulating film 18 is formed of a high dielectric constant (High-k) film, it is preferable to remove the film 18 because the remaining of the film 18 leads to a high capacitance.

In subsequent steps, an interlayer insulating film as an upper layer is formed on the gate electrode 19 and the interlayer insulating film 16, followed by interconnect formation and so on, similarly to a manufacturing method for a typical PMOSFET.

According to such a method for manufacturing a semiconductor device and a semiconductor device obtained based on the method, the second gate electrode layer 19b having a barrier property for protecting the underlayers is formed on the first gate electrode layer 19a. This prevents damage to the first gate electrode layer 19a and the gate insulating film 18 due to $WF_6$ employed as a deposition gas at the time of formation of the third gate electrode layer 19c composed of W by CVD on the second gate electrode layer 19b. Consequently, an enhanced yield of the semiconductor device can be achieved.

Furthermore, the third gate electrode layer 19c of which resistance is lower than that of the first gate electrode layer 19a is formed, which offers the gate electrode 19 having a lower resistance. This shortens the time until the voltage applied to the transistor reaches the threshold voltage of the transistor, which enhances the transistor speed and reduces the power consumption of the transistor. Thus, the transistor is allowed to achieve higher performance and lower power consumption.

In addition, according to the present embodiment, the third gate electrode layer 19c composed of W is buried by CVD in the recess 17 over which the second gate electrode layer 19b is provided, which allows the recess 17 to be filled without the occurrence of a void. This can prevent increase in the gate resistance and deterioration of transistor characteristics attributed to the void.

Moreover, according to the present embodiment, the gate electrode 19 is buried in the recess 17 arising from removal of the dummy electrode 13. Therefore, the gate insulating film 18 and the gate electrode 19 are formed after formation of the source and drain regions 14 and 15. This can prevent the gate insulating film 18 and the gate electrode 19 from being damaged due to thermal treatment for impurity activation.

Figure 3:
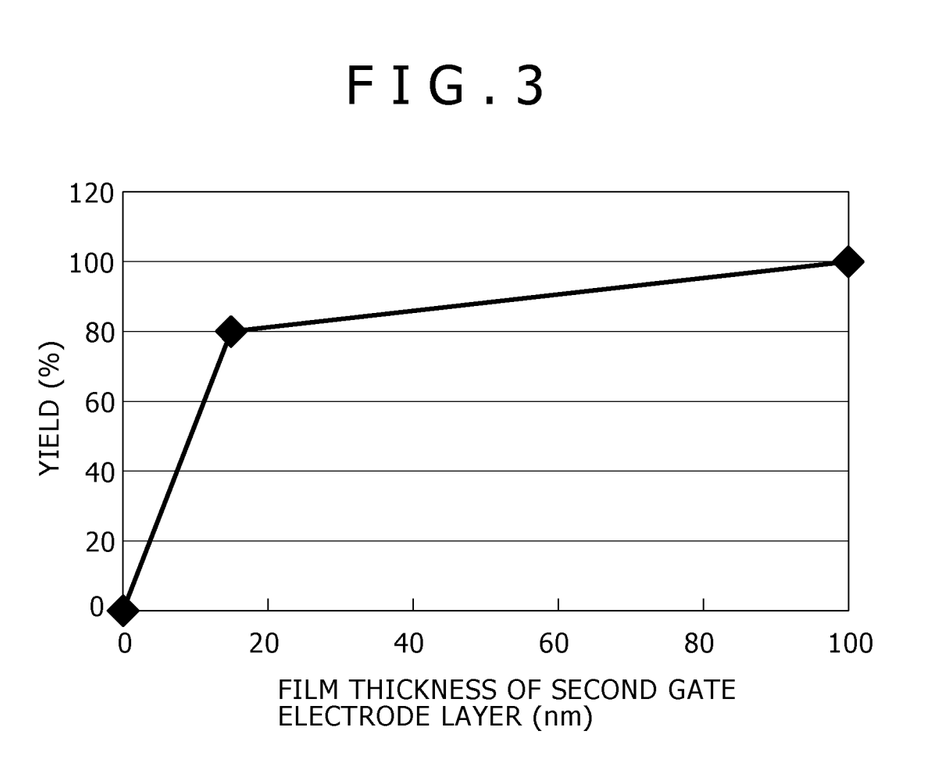
FIG. 3 is a graph showing the relationship between the film thickness of a second gate electrode layer and a yield.

FIG. 3 is a graph showing the yield of a semiconductor device as a function of the film thickness of the second gate electrode layer 19b, obtained when the gate electrode 19 was formed by the same method as that of the first embodiment. The semiconductor devices of this graph were manufactured in the following manner. Specifically, the recess 17 was formed to have a width of 70 nm to 80 nm, and then the gate insulating film 18 composed of $HfO_2$ was formed to a thickness of 3 nm. Subsequently, the first gate electrode layer 19a composed of Ru was formed to a thickness of 5 nm, and then the second gate electrode layer 19b composed of W was formed by PVD to a thickness of 15 nm and 100 nm, respectively. Subsequently, the third gate electrode layer 19c composed of W was formed by CVD in such a manner as to fill the recess 17, over which the second gate electrode layer 19b was formed. Thereafter, the third gate electrode layer 19c, the second gate electrode layer 19b, the first gate electrode layer 19a, and the gate insulating film 18 were removed by CMP until the surface of the interlayer insulating film 16 was exposed, so that the gate electrode 19 was formed in the recess 17.

As shown in this graph, the yield was 0% when the third gate electrode layer 19c was formed directly on the first gate electrode layer 19a without formation of the second gate electrode layer 19b therebetween. In contrast, significant improvements in the yield were observed when a manufacturing method according to the embodiment was applied. Specifically, the yield was increased to 80% when the film thickness of the second gate electrode layer 19b was 15 nm, and the yield was increased to 100% when the film thickness of the second gate electrode layer 19b was 100 nm.

Second Embodiment

Although a gate electrode is formed in such a manner as to be buried in the example of the first embodiment, an embodiment of the present invention can be applied also to an example in which a gate electrode is formed through patterning thereof over a semiconductor substrate with the intermediary of a gate insulating film. A manufacturing method according to a second embodiment of the present invention will be described below with reference to FIGS. 4A to 4D, which are sectional views of manufacturing steps. The materials and so on that can be used for the respective components in the second embodiment are the same as those in the first embodiment, and hence only one example of the materials and so on will be described below.

Figure 4A:
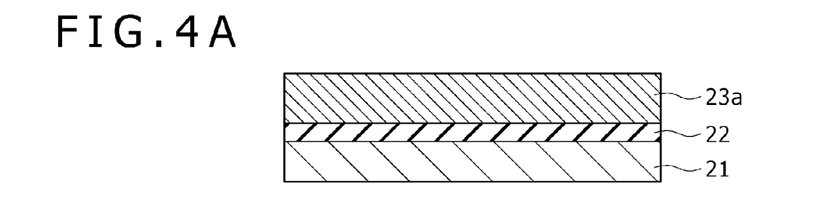
FIGS. 4A to 4D are sectional views for explaining manufacturing steps of a method for manufacturing a semiconductor device according to a second embodiment of the invention.
Figure 4B:
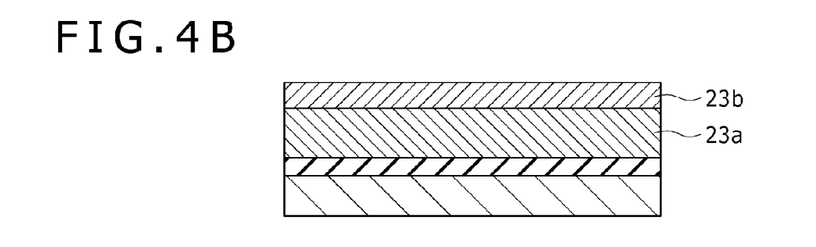
Figure 4C:
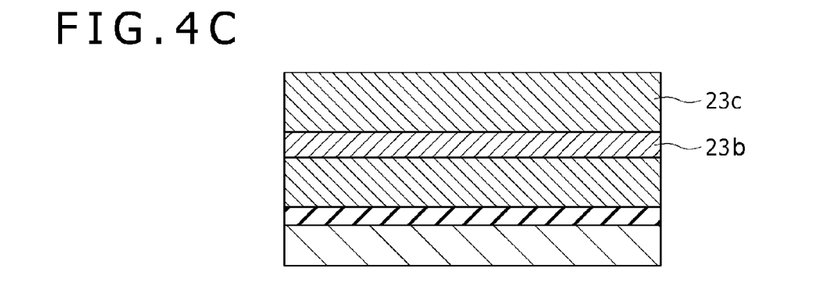
Figure 4D:
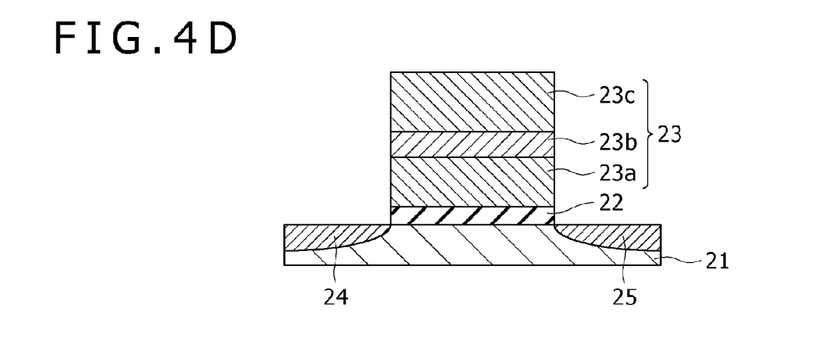

Initially, as shown in FIG. 4A, a gate insulating film 22 composed of e.g. $HfO_2$ is formed on a semiconductor substrate 21. Thereafter, a first gate electrode layer 23a that defines the work function of the gate electrode and is composed of e.g. Ru is formed on the gate insulating film 22. Subsequently, as shown in FIG. 4B, W is deposited by e.g. PVD on the first gate electrode layer 23a to thereby form a second gate electrode layer 23b having a barrier property for protecting the underlayers. Next, as shown in FIG. 4C, a third gate electrode layer 23c composed of e.g. W is formed by CVD on the second gate electrode layer 23b. Subsequently, a resist pattern (not shown) is formed on the third gate electrode layer 23c, and patterning is carried out with use of this resist pattern as the mask. Thereby, as shown in FIG. 4D, a gate electrode 23 arising from sequential deposition of the first gate electrode layer 23a, the second gate electrode layer 23b, and the third gate electrode layer 23c is patterned. Thereafter, a p-type impurity is introduced into the semiconductor substrate 21 on both the sides of the gate electrode 23 and the impurity is activated through thermal treatment, so that source and drain regions 24 and 25 are formed.

Subsequent steps are similar to those in a manufacturing method for a typical PMOSFET.

According also to such a method for manufacturing a semiconductor device and a semiconductor device obtained based on the method, the third gate electrode layer 23c is formed by CVD on the second gate electrode layer 23b after the second gate electrode layer 23b having a barrier property for the underlayers is formed on the first gate electrode layer 23a. Therefore, similarly to the first embodiment, the second embodiment makes it possible to enhance the yield of the semiconductor device and achieve higher performance and lower power consumption of the transistor.

Although examples of a manufacturing method for a PMOSFET have been explained in the above description of the first and second embodiments, the embodiments can be applied also to an NMOSFET. In this case, in order to achieve a proper threshold voltage of the NMOSFET, a metal-containing material that contains Hf or Ta is used as the material of the first gate electrode layer 19a(23a) having a proper work function (3.9 eV to 4.3 eV). As the Hf-containing material, besides Hf, any of hafnium silicide (HfSi), hafnium silicon nitride (HfSiN), and hafnium nitride (HfN) is available. As the Ta-containing material, besides Ta, any of tantalum silicide (TaSi), tantalum silicon nitride (TaSiN), and tantalum nitride (TaN) is available.

Moreover, the embodiments of the present invention can be preferably used to a complementary metal oxide semiconductor (CMOS) FET, in which a PMOSFET and an NMOSFET are integrated on the same semiconductor substrate. In this case, a first gate electrode layer employed for the PMOSFET and composed of e.g. Ru is formed over the semiconductor substrate with the intermediary of a gate insulating film, and then the Ru film in the NMOS region is removed. Subsequently, a first gate electrode layer employed for the NMOSFET and composed of e.g. Hf is formed over the semiconductor substrate in the NMOS region. Thereafter, a second gate electrode layer and a third gate electrode layer that are common to the NMOS region and the PMOS region are sequentially deposited on the first gate electrode layers, which are different from each other between the NMOS region and the PMOS region, so that a gate electrode is formed.

It should be understood by those skilled in the art that various modifications, combinations, sub-combinations and alterations may occur depending on design requirements and other factors insofar as they are within the scope of the appended claims or the equivalents thereof.

What is claimed is:

1. A method for manufacturing a semiconductor device, the method including a step of forming a gate electrode that contains a metal over a semiconductor substrate, the step comprising the sub-steps of:
    (a) forming a recess in an insulating film;
    (b) after forming the recess, forming a gate insulating film to cover a recess portion and a non-recess portion of the insulating film, the gate insulating film being formed to line an entire recess portion such that the gate insulating film is in contact with (i) inner walls of the insulating film that constitute the recess and (ii) a portion of the semiconductor substrate that constitutes an entire bottom surface of the recess portion,
    (c) forming a first gate electrode layer over the gate insulating film provided in the recess of the insulating film, the first gate electrode layer defining a work function of the gate electrode on the gate insulating film;
    (d) forming a second gate electrode layer in the recess portion by nitriding only a surface portion of the first gate electrode layer so that the second gate electrode layer comprises the nitrided surface portion of the first gate electrode layer and has a barrier property for protecting the first gate electrode layer under the nitrided surface portion; and
    (e) forming, on the second gate electrode layer by chemical vapor deposition, a third gate electrode layer with a resistance that is lower than a resistance of the first gate electrode layer,
    wherein,
        the second gate electrode layer has a barrier property effective against deposition gas employed for the chemical vapor deposition in the step (e).

2. The method of manufacturing a semiconductor device according to claim 1, wherein the third gate electrode layer is made of tungsten.

3. The method for manufacturing a semiconductor device according to claim 1, wherein in the step (d), the second gate electrode layer comprises a nitride of any of tantalum, titanium, hafnium or molybdenum.

4. The method of claim 1, wherein the formation of the second gate electrode layer via nitriding comprises performing plasma nitridation on the surface portion of the first gate electrode layer.

5. The method of claim 1, wherein the formation of the second gate electrode layer via nitriding comprises performing thermal nitridation on the surface portion of the first gate electrode layer.

6. A method for manufacturing a semiconductor device, the method including a step of forming a gate electrode that contains a metal over a semiconductor substrate, the step comprising the sub-steps of:
- (a) forming a recess in an insulating film,
- (b) after forming the recess, forming a gate insulating film to cover a recess portion and a non-recess portion of the insulating film, the gate insulating film being formed to line an entire recess portion such that the gate insulating film is in contact with (i) inner walls of the insulating film that constitute the recess and (ii) a portion of the semiconductor substrate that constitutes an entire bottom surface of the recess portion,
- (c) forming a first gate electrode layer that defines a work function of the gate electrode on the gate insulating film;
- (d) forming a second gate electrode layer in the recess portion by nitriding only a surface portion of the first gate electrode layer so that the second gate electrode layer comprises the nitrided surface portion of the first gate electrode and has a barrier property for protecting layers of the first gate electrode layer and the gate insulating film under the nitrided surface portion; and
- (e) forming, on the second gate electrode layer by chemical vapor deposition, a third gate electrode layer with a resistance that is lower than a resistance of the first gate electrode layer, and
- (f) removing a portion of the first gate electrode layer, the second gate electrode layer, and the gate insulating film to provide a planarized surface that exposes the first gate electrode layer, the second gate electrode layer, and the gate insulating film;

wherein,
the gate electrode is formed in such a manner as to be buried in a recess that is formed in an insulating film on the semiconductor substrate.

7. The method for manufacturing a semiconductor device according to claim 6, wherein in the step (d), the second gate electrode layer is comprises a nitride of any of titanium, hafnium and molybdenum.

* * * * *